United States Patent [19]

Ono

[11] Patent Number: 5,789,798
[45] Date of Patent: Aug. 4, 1998

[54] LOW NOISE PROPAGATION SEMICONDUCTOR DEVICE

[75] Inventor: Hajime Ono, Tokyo, Japan

[73] Assignee: NEC Corporation, Tokyo, Japan

[21] Appl. No.: 656,634

[22] Filed: May 31, 1996

[30] Foreign Application Priority Data

Jun. 2, 1995 [JP] Japan ................................. 7-136250

[51] Int. Cl.$^6$ ................................................ H01L 29/00
[52] U.S. Cl. .................................. 257/557; 257/544
[58] Field of Search ............................. 257/557, 556, 257/555, 554, 558, 563, 564, 565, 474, 544; 438/414

[56] References Cited

U.S. PATENT DOCUMENTS

| | | | |
|---|---|---|---|
| 3,197,681 | 7/1965 | Broussard | 257/565 |
| 3,615,938 | 10/1971 | Tsai | 257/565 |
| 3,758,797 | 9/1973 | Peterson et al. | 257/565 |
| 3,946,425 | 3/1976 | Shoji et al. | 257/563 |
| 4,110,782 | 8/1978 | Nelson et al. | 257/557 |
| 4,170,501 | 10/1979 | Khajezadeh | 257/555 |
| 4,792,837 | 12/1988 | Zazzu | 257/557 |

FOREIGN PATENT DOCUMENTS

| | | | |
|---|---|---|---|
| 58-159346 | 9/1983 | Japan | 257/557 |
| 59-211272 | 11/1984 | Japan | 257/557 |

*Primary Examiner*—Sara W. Crane
*Assistant Examiner*—Phat X. Cao
*Attorney, Agent, or Firm*—Sughrue, Mion, Zinn, Macpeak & Seas, PLLC

[57] ABSTRACT

A semiconductor device has a p-n-p transistor structure having a collector implemented by a p$^-$-substrate, a base formed as an n-diffused region in the surface region of the substrate, and an emitter formed as a p$^+$-diffused region in the first n-diffused layer. The p$^-$-substrate and the n-base are maintained at a ground level, while the p$^+$-collector is maintained at a positive potential for biasing the p-n junction formed between the emitter and the base. The bias potential allows the p-n-p transistor structure to operate in its saturation region to activate the base region to define an enlarged carrier-incresed zone. An analog input pad is located within the carrier-increased zone and protected from a noise propagated from a digital circuit section located outside the carrier-increased zone.

14 Claims, 3 Drawing Sheets

5,789,798

1

LOW NOISE PROPAGATION SEMICONDUCTOR DEVICE

BACKGROUND OF THE INVENTION

(a) Field of the Invention

The present invention relates to a low noise propagation semiconductor device and, in particular, to a semiconductor device which allows a low noise propagation between circuit sections and which is suitable for use as an analog amplifier or an analog-digital hybrid circuit.

(b) Description of the Related Art

Circuit sections including circuit elements, wirings, input pads etc. disposed in combination or alone in a semiconductor integrated circuit (IC) are generally formed on the surface region of a semiconductor substrate or a semi-insulating substrate. Such circuit sections are insulated in terms of D.C. circuit from the substrate or from each other by an insulator or by a depletion layer of a reverse-biased p-n junction, as required. However, a potential change on a circuit section which occurs as a result of a signal change is transmitted more or less in terms of A.C. circuit through a parasitic capacitance, thus generating a potential change in other circuit sections and the substrate. Conversely, a potential change in the substrate is transmitted to such circuit sections through the parasitic capacitance. In this regard, a conventional circuit configuration will be described below in connection with a silicon substrate, by way of example.

FIG. 1 is a top plan view of an example of the conventional circuit configuration of a semiconductor device, and FIG. 2 is a cross-sectional view taken along line II—II in FIG. 1. A semiconductor substrate 11 is of p$^-$-type having an impurity concentration of $1\times10^{15}$ atoms/cm$^3$ (1E15 cm$^{-3}$) and has a thickness of about 200 µm, for example. A plurality of output n-p-n transistors 12 each having a 20 µm wide collector region 12a of n-type is formed on the surface region of the semiconductor substrate 11. A plurality of input pads 13 are formed at a distance of about 30 µm spaced from each of the output transistors 12. A 7 substrate electrode 23 is formed on the rear surface of the substrate 11 and is grounded. Each of the collector regions 12a of the transistors 12 is maintained at a positive potential with respect to the semiconductor substrate 11 in order to reverse-bias the p-n junction formed between the substrate 11 and the collector regions 12a.

In the described construction, an output signal voltage of the output transistor 12 which appears at the collector regions 12a acts through a parasitic capacitance to generate a potential change in the region of the substrate 11 located immediately below the collector layer 12a. The potential change is transmitted to another region of the substrate located immediately below the input pad 13 in the manner as mentioned above.

Among other circuit sections, in general, a buried collector layer or an output pad of an output transistor exhibits a relatively large parasitic capacitance between the same and the substrate. Since a signal appearing on such circuit sections generally has a large amplitude and hence causes a large influence upon the potential of the surface region of the substrate. Depending on the input impedance and signal frequency of the input, the feedback which transmits a feed-back signal from the buried collector layer of an output transistor to an input pad may amount as large as a potential between one part per several hundreds and one part per several tens.

In the construction as shown in FIGS. 1 and 2, the potential change which is about 0.3 times that occurring

2 immediately below the collector region 12a was observed on the substrate surface at a point which is 30 µm spaced from the output transistor 12. If an input pad is disposed at this location, the observed potential change will be directly transmitted to the input pad 13 assuming that the equivalent circuit element has an input impedance of infinity, and will be transmitted to the pad at a reduced proportion since the input impedance is finite. The potential change which is transmitted through the substrate 11 in this manner has a significant influence upon an analog IC or an analog-digital hybrid IC having both analog and digital circuits mounted on a single substrate to the extent that the circuit performance itself may be governed thereby.

The propagation of such potential change has a greater influence, in particular, upon a semiconductor device which operates at a higher speed. For example, a noise pulse on a potential source having an amplitude of 5V output from a CMOS digital circuit may cause a noise of several tens of mV to the input of a pre-amplifier of an analog circuit. Also, a feedback which occurs in the manner mentioned above from the output to the input of an analog amplifier having a high amplification factor may cause an instability upon the operation of the circuit itself.

Means which has been generally employed in order to avoid the influences of potential changes such as described above is to provide a sufficient distance for separation between the input or output section on one hand and the power source on the other hand which generally generates a significant potential change. However, this cannot always achieve a satisfactory effect for a practical purpose because of limitations imposed on the circuit arrangement.

Another approach is to dispose an electrode between an input section and an output section so as to fix the potential of a surface region of the substrate. FIGS. 3 and 4 show, similarly to FIGS. 1 and 2, respectively, a second example of a semiconductor device which incorporates such approach. In the example shown, the arrangements in FIGS. 1 and 2 are duplicated, and in addition, a stripe p$^+$-diffused region 15, which is 6 µm wide, for example, is interposed between the output transistors 12 and the input pads 13 so as to separate them from each other. The p$^+$-diffused region 15 is connected to the substrate electrode 23 through the electrode 16 in order to maintain the p$^+$-diffused layer 15 at the substrate potential.

However, with the improved construction, the p$^+$-diffused layer 15 is only effective for fixing the potential in the vicinity of the substrate surface, and the resulting effect is only limited. To give an example, a potential change which occurs at a point such as mentioned in the first example was measured also in the structure of FIGS. 3 and 4 to amount a potential change approximately equal to 0.2 times the potential change in the surface region which occurred directly below the buried collector layer 12a. While the magnitude of the potential change itself is reduced as compared with the first example, such result is less than satisfactory.

SUMMARY OF THE INVENTION

In view of the foregoing, it is an object of the present invention to provide a low noise propagation semiconductor device having an improved circuit accuracy and stability by suppressing a potential change transmitted between circuit sections through a substrate.

In accordance with the present invention, there is provided a semiconductor device comprising a substrate having a surface region, a first diffused region formed in the surface region and having a first conductivity, a second diffused region formed in the first diffused region and having a second conductivity opposite to the first conductivity, circuit means for maintaining the first diffused region at a first potential, e.g., which is equal to a potential of the substrate, bias means for applying a forward-bias to a junction formed between the first diffused region and second diffused region, the forward-bias generating a carrier-increased zone within the substrate in the vicinity of the first diffused region, and a first and a second circuit sections located within the carrier-increased zone and outside the carrier-increased zone, respectively.

It is to be noted that the circuit sections as termed herein refers to circuit elements, input pads, etc. which can obtain the effect of alleviating the influence of the potential change transmitted therebetween, and are not limited to any specific circuit sections or circuit elements.

The substrate may be either semiconductor or semi-insulating substrate. Where a semiconductor substrate is used, a substrate of the second conductivity type is generally employed.

In the preferred embodiment of the present invention, switching means is provided to turn the bias voltage on or off in correspondence to a normal operational mode or a standby mode for a given circuit section. This reduces the current dissipation of the circuit.

In the semiconductor device according to the present invention, by applying forward bias voltage to a p-n junction formed between a second semiconductor region having a second conductivity type and a first semiconductor region having a first conductivity type, a bipolar transistor structure is formed having its emitter, base and collector implemented by the second diffused region, the first diffused region and the substrate, respectively.

By operating the transistor structure in its saturation region, a carrier-increased zone having an increased carrier concentration is produced within the substrate in the vicinity of the first diffused region wherein the potential is fixed by the bias voltage, thereby reducing the potential change which is propagated from the second circuit section located outside the carrier-increased zone to the first circuit section located in the carrier-increased zone.

DESCRIPTION OF THE PREFERRED EMBODIMENT

Figure 1:
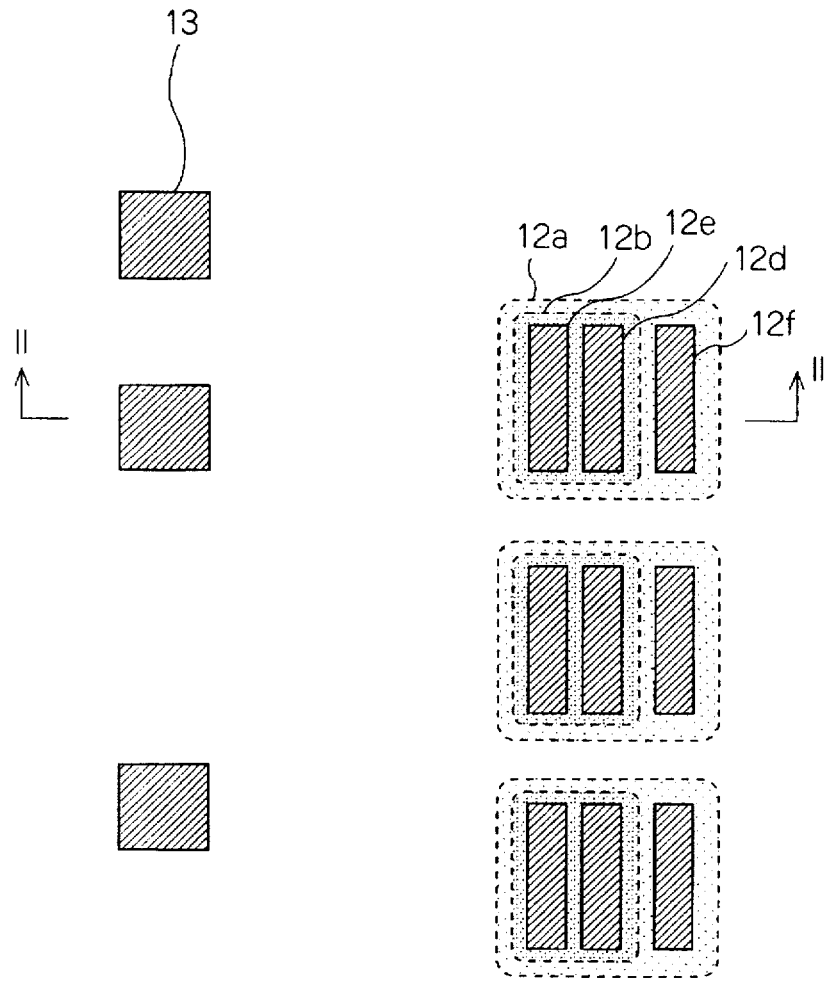
FIG. 1 is a top plan view of a first example of a conventional semiconductor device.
Figure 2:
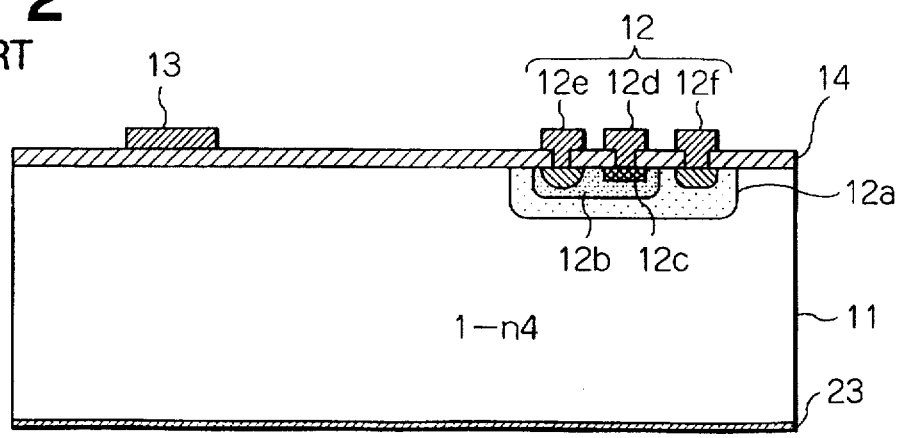
FIG. 2 is a cross-sectional view taken along line II—II in FIG. 1.
Figure 3:
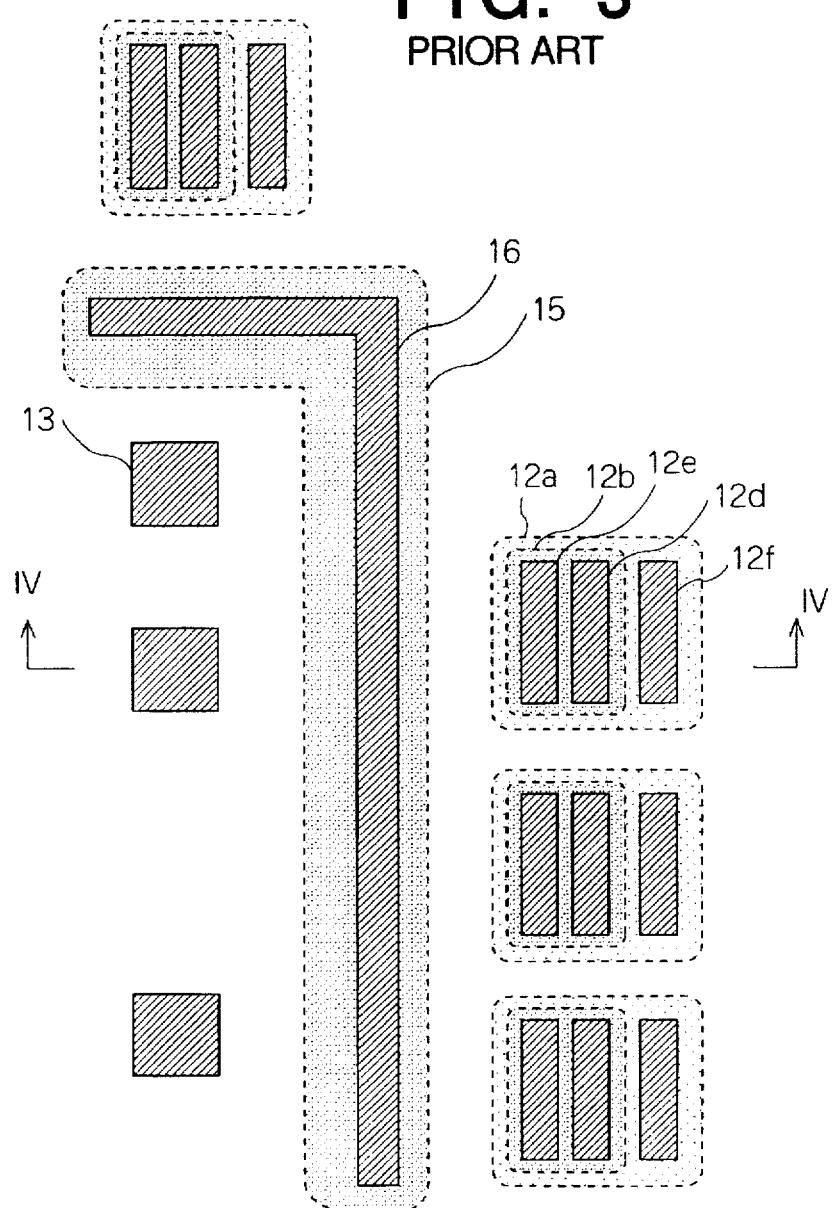
FIG. 3 is a top plan view of a second example of a conventional semiconductor device.
Figure 4:
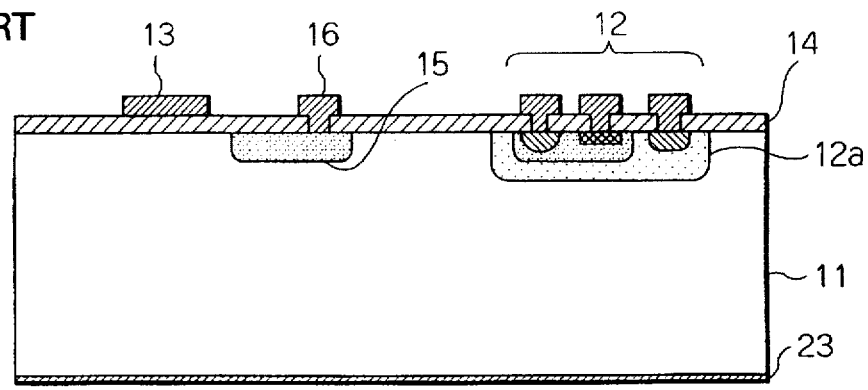
FIG. 4 is a cross-sectional view taken along-line IV—IV in FIG. 3.
Figure 5:
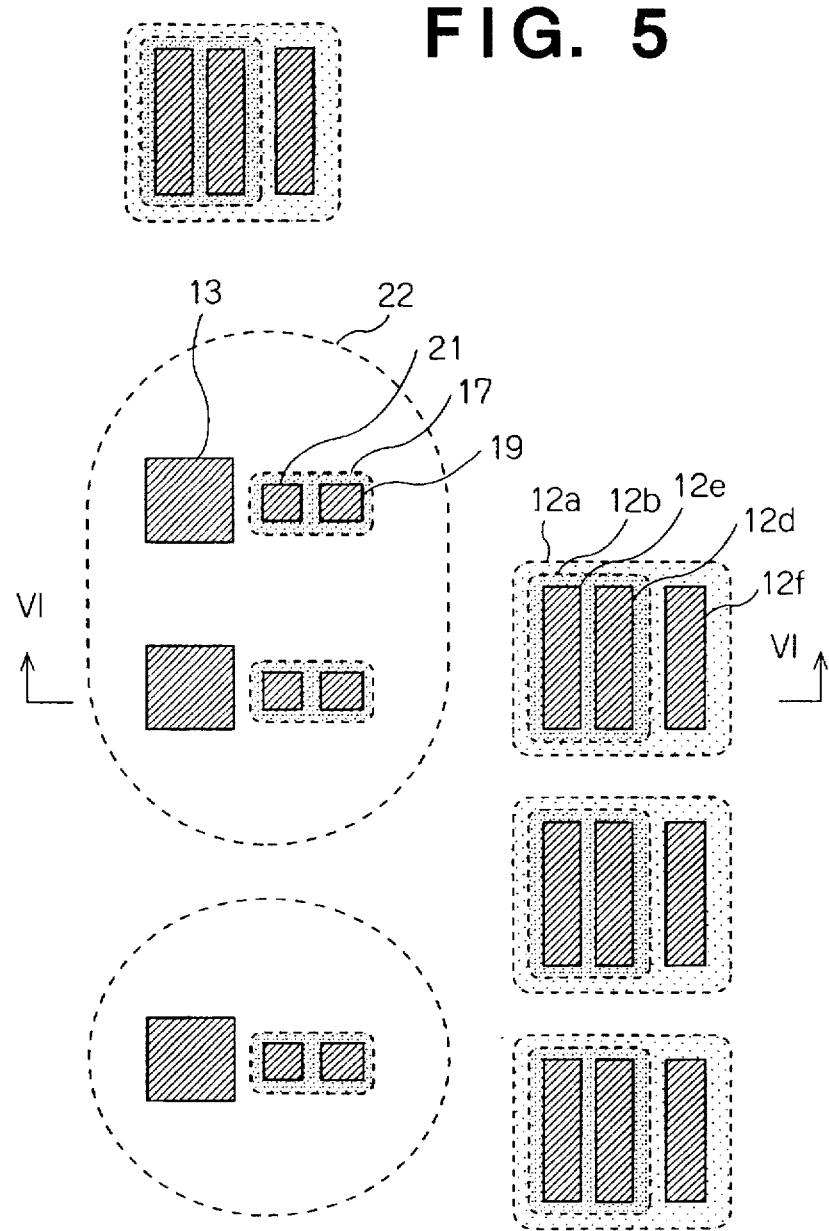
FIG. 5 is a top plan view of a semiconductor device according to an embodiment of the present invention.
Figure 6:
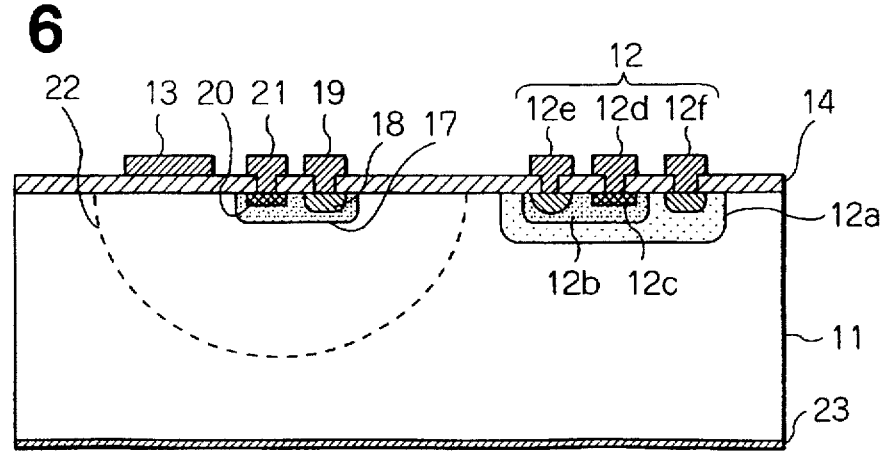
FIG. 6 is a cross-sectional view taken along line VI—VI in FIG. 5.

FIGS. 5 and 6 show a preferred embodiment of a low noise propagation semiconductor device according to the present invention. The semiconductor device includes a silicon substrate 11 of $p^-$-type having an impurity concentration (carrier concentration) of $1E15/cm^3$ and a thickness of 200 μm, for example, and a silicon oxide film 14 formed on the surface of the silicon substrate 11.

A plurality of output n-p-n bipolar transistors 12 are formed in the surface region of the silicon substrate 11. Each of the n-p-n output transistors 12 includes a 20 μm wide $n^+$-diffused collector layer 12a formed in the surface region, a $p^+$-diffused base layer 12b formed in the collector layers 12a and an $n^+$-diffused emitter layer 12c formed in the base layer 12b. An emitter electrode 12d, a base electrode 12e and a collector electrode 12f are formed for the emitter layer 12c, base layer 12b and collector layer 12a, respectively. A plurality of input pads 13 are disposed on the substrate surface at a distance of about 30 μm spaced from each of the output transistors 12.

A substrate electrode 23 is formed on the rear surface of the silicon substrate 11, and is maintained at the ground potential. The collector layer 12a of the output transistor 12 is maintained at a positive potential with respect to the substrate 11 in order to reverse bias the p-n junction formed between the substrate 11 and the $n^+$-diffused collector layer 12a.

In the vicinity of each of the input pads 13, there is provided a p-n-p bipolar transistor structure for the each of the input pads 13. The p-n-p transistor structure includes a $p^-$-collector implemented by a surface region of the substrate 11, an n-diffused base region 17 formed in the surface region of the substrate 11, and a $p^+$-diffused emitter layer 20 formed within the n-diffused base layer 17. The base region 17 has an impurity concentration of $1E18/cm^3$, a width of 6 μm and a depth of 1 μm, while the emitter region 20 has an impurity concentration of $1E20/cm^3$, a width of 2 μm and a depth of 0.3 μm. The n-diffused base layer 17 and the $p^+$-diffused emitter layer 20 are connected to a base electrode 19 through a $n^+$-contact layer 18 and to an emitter electrode 21 directly, respectively.

In operation of the p-n-p transistor structure, the base electrode 19 is grounded while a positive bias voltage equal to or greater than a given value is applied to the emitter electrode 21 with respect to the substrate 11 to forward-bias the p-n junction formed between the emitter region 20 and the base region 17.

When the positive bias voltage is applied to the emitter electrode, the p-n-p transistor structure operates in its saturation region, and a base expansion effect takes place to provide a carrier-increased zone 22 having an increased population of carriers (electrons and positive holes) within the substrate 11 in the vicinity of the base region 17, the carrier-increased zone 22 having a carrier concentration, for example, not less than about double the carrier concentration in the other region of the substrate 11, i.e. $2E15/cm^3$.

The potential inside the carrier-increased zone 22 is substantially determined by the potential applied to the emitter layer 20 irrespective of a potential change on the collector 12a of the output transistor 12 which is located outside the carrier-increased zone 22, or at least, is less susceptible to the potential change. Namely, the potential change which is transmitted from the output transistor 12 through the substrate to the input pad 13 disposed on the surface of the zone 22 is greatly reduced in the present embodiment.

In the construction shown in FIGS. 5 and 6, while it was in operation, a potential change of the substrate surface located immediately below the input pad 13 was measured to amount on the order of 1/200 times the potential change occurring in the substrate potential immediately below the buried collector layer 12a or less, exhibiting a drastic reduction as compared to the arrangements of the first and second examples of the conventional semiconductor devices. Thus, it is found that an input pad or a collector region of an input transistor should be disposed in the carrier-increased zone rather than enlarging the distance between the input pad or the collector region and the output transistors.

In the described configuration, it is possible that the influence of any potential change propagated from the output section to the input section is disregarded in a given time period depending on the circuit mode or state. For example, in an analog-digital hybrid IC, when the operation of a digital circuit section is temporarily quiescent as while waiting for an input signal, there is substantially no noise propagating from the digital circuit section to the analog circuit section, and accordingly, it is unnecessary to maintain the carrier-increased zone 22 for shielding purpose at that period. In such a case, a switching means is further provided in the embodiment. When the quiescent circuit mode is detected, the bias voltage is turned off by the switching means, thereby reducing a current flow from the emitter electrode 21 to zero and reducing power dissipation.

In the described embodiment, the substrate has been illustrated as a $p^-$-type semiconductor substrate. However, the substrate need not be limited thereto, and the present invention is equally applicable where the substrate is an n-type semiconductor substrate or semi-insulating substrate. It is also to be noted that the material, the values and lay-outs shown in the embodiment are only examples, and that a number of changes, modifications or substitutions in the embodiment disclosed may be possible within the scope of the present invention defined by the appended claims.

What is claimed is:

1. A semiconductor device comprising a substrate having a surface region with a first circuit section, a second circuit section and a circuit structure;

said circuit structure having a first diffused region formed in said surface region and having a first conductivity, a second diffused region formed in said first diffused region and having a second conductivity opposite to said first conductivity, circuit means for maintaining said first diffused region at a first potential, bias means for applying a forward-bias to a junction formed between said first diffused region and said second diffused region, said forward-bias generating a carrier-increased zone within said substrate in the vicinity of said first diffused region;

said first circuit section located within said carrier-increased zone and said second circuit section located outside said carrier increased zone.

2. A semiconductor device as defined in claim 1 wherein said substrate is a semiconductor substrate having said second conductivity and a first carrier concentration, said first diffused region has a second carrier concentration higher than said first carrier concentration.

3. A semiconductor device as defined in claim 2, wherein said carrier-increased zone has a third carrier concentration not less than double said first carrier concentration.

4. A semiconductor device as defined in claim 1 further including switching means for turning said bias means off to thereby remove said carrier-increased zone.

5. A semiconductor device as defined in claim 1 wherein said substrate is a semi-insulating substrate.

6. A semiconductor device as defined in claim 1 wherein said first circuit section includes an analog circuit and said second circuit section includes at least one of a digital circuit and a potential source line.

7. A semiconductor device as defined in claim 1 wherein said first potential is equal to a potential of said substrate.

8. A semiconductor device comprising a substrate having a surface region with a plurality of first circuit sections, a plurality of second circuit sections and a plurality of circuit structures corresponding to each of said plurality of first circuit sections;

each of said plurality of circuit structures having a first diffused region formed in said surface region and having a first conductivity, a second diffused region formed in said first diffused region and having a second conductivity opposite to said first conductivity, circuit means for maintaining said first diffused region at a first potential, bias means for applying a forward-bias to a junction formed between said first diffused region and second diffused region, said forward-bias generating a carrier-increased zone within said substrate in the vicinity of said first diffused region;

each of said plurality of first circuit sections located within the carrier-increased zone of each corresponding circuit structure and each of said plurality of second circuit sections located outside the carrier-increased zone of each of said plurality of circuit structures.

9. A semiconductor device as defined in claim 8, wherein said substrate is a semiconductor substrate having said second conductivity and a first carrier concentration, said first diffused region has a second carrier concentration higher than said first carrier concentration.

10. A semiconductor device as defined in claim 9, wherein said carrier-increased zone has a third carrier concentration not less than double said first carrier concentration.

11. A semiconductor device as defined in claim 8, further including switching means for turning said bias means off to thereby remove said carrier-increased zone.

12. A semiconductor device as defined in claim 8, wherein said substrate is a semi-insulating substrate.

13. A semiconductor device as defined in claim 8, wherein said plurality of first circuit sections each include an analog circuit and said plurality of second circuit sections each include at least one of a digital circuit and a potential source line.

14. A semiconductor device as defined in claim 8 wherein said first potential is equal to a potential of said substrate.

* * * * *